(12) United States Patent
Kim et al.

(10) Patent No.: US 12,534,426 B2
(45) Date of Patent: Jan. 27, 2026

(54) LEVELER AND ELECTROPLATING COMPOSITION FOR FILLING VIA HOLE

(71) Applicant: YMT CO., LTD., Incheon (KR)

(72) Inventors: Dea Geun Kim, Incheon (KR); Sung Wook Chun, Incheon (KR); Bo Mook Chung, Incheon (KR); Nak Eun Ko, Bucheon-si (KR)

(73) Assignee: YMT CO., LTD., Incheon (KR)

( * ) Notice: Subject to any disclaimer, the term of this patent is extended or adjusted under 35 U.S.C. 154(b) by 0 days.

(21) Appl. No.: 18/342,397

(22) Filed: Jun. 27, 2023

(65) Prior Publication Data

US 2024/0140905 A1    May 2, 2024

(30) Foreign Application Priority Data

Jun. 28, 2022 (KR) .................. 10-2022-0078842

(51) Int. Cl.
| | | |
|---|---|---|
| *C07D 401/14* | (2006.01) | |
| *C07C 217/76* | (2006.01) | |
| *C07D 233/64* | (2006.01) | |
| *C07D 241/12* | (2006.01) | |
| *C09K 11/00* | (2006.01) | |
| *C25D 3/38* | (2006.01) | |

(52) U.S. Cl.
CPC .......... *C07C 217/76* (2013.01); *C07D 233/64* (2013.01); *C07D 241/12* (2013.01); *C25D 3/38* (2013.01)

(58) Field of Classification Search
CPC .......... C07D 401/14; C25D 5/02; C25D 3/00; C09K 11/00
USPC .................. 546/256; 205/122; 252/301.26
See application file for complete search history.

(56) References Cited

U.S. PATENT DOCUMENTS 8,388,824 B2 *   3/2013   Paneccasio, Jr. ... H01L 21/2885
                                                         205/291

FOREIGN PATENT DOCUMENTS

| CN | 113463142 A | 10/2021 |
|---|---|---|
| JP | 2015227327 A | 12/2015 |
| JP | 2016538374 A | 12/2016 |
| JP | 2021511439 A | 5/2021 |
| KR | 100439534 B1 | 7/2004 |
| KR | 20160076536 A | 6/2016 |
| KR | 20190061627 A | 6/2019 |
| KR | 102339862 B1 | 12/2021 |
| KR | 102339866 B1 | 12/2021 |
| KR | 102339868 81 | 12/2021 |

* cited by examiner

*Primary Examiner* — Charanjit Aulakh
(74) *Attorney, Agent, or Firm* — STIP Law Group, LLC

(57) ABSTRACT

The present invention relates to a leveler capable of efficiently filling the inside of via holes formed during the manufacturing process of a printed circuit board, and an electroplating composition comprising the same. When via holes on a substrate are filled with the electroplating composition according to the present invention, the via holes can be filled in a relatively short time while minimizing the formation of dimples or voids.

5 Claims, 4 Drawing Sheets

Example 1

[Figure 5B]

Example 2

[Figure 5C]

Example 3

[Figure 5D]

Comparative Example 1

[Figure 5E]

Comparative Example 2

[Figure 5F]

Comparative Example 3

[Figure 6A]

Example 1

[Figure 6B]

Example 2

[Figure 6C]

Example 3

[Figure 6D]

Comparative
Example 1

[Figure 6E]

Comparative
Example 2

[Figure 6F]

Comparative
Example 3

LEVELER AND ELECTROPLATING COMPOSITION FOR FILLING VIA HOLE

CROSS-REFERENCE TO RELATED APPLICATIONS

This application claims the priority of the Korean Patent Applications NO 10-2022-0078842, filed on Jun. 28, 2022, in the Korean Intellectual Property Office. The entire disclosures of all these applications are hereby incorporated by reference.

TECHNICAL FIELD

The present invention relates to a leveler and an electroplating composition for filling via hole comprising the same, and more specifically, to a leveler and an electroplating composition for filling via hole comprising the same, which are capable of efficiently filling the inside of a via hole formed in the manufacturing process of a printed circuit board.

BACKGROUND ART

In general, a printed circuit board is manufactured by forming metal wiring on one or both surfaces of a substrate made of various synthetic resins and then arranging and fixing semiconductor chips, integrated circuits (ICs) or electronic components, and implementing electric wiring between them. These printed circuit boards are being multi-layered, miniaturized, or made into highly integrated circuits in accordance with the trend requiring high density, high performance, and thin film of electronic device for high density packaging.

Figure 2A:
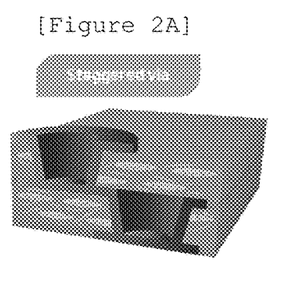
FIGS. 2A, 2B, and 2C show various types of via holes according to an embodiment of the present invention.
Figure 2B:
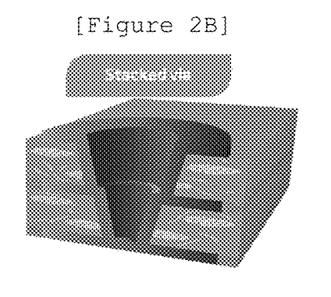
Figure 2C:
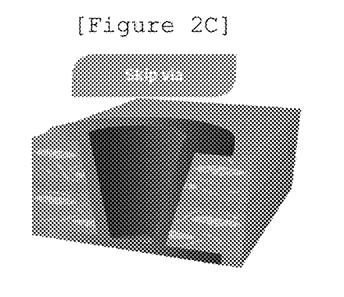

Multilayering of the printed circuit board is implemented through a build-up method or a via hole method. Among them, in the case of via holes, stacked vias are generally used for small and medium diameters, and skip vias are used for large diameters, respectively (see FIGS. 2A-2C). In general, although stacked vias and skip vias are used to connect the top and bottom of two or more layers of boards, there is a difference in that the stacked vias have a form in which the via holes formed in each layer are vertically extended, and the skip vias form via holes that penetrate two or more layers simultaneously.

As an electrical connection method using electroless copper plating on the holes and walls of micro vias, stacked vias have been widely used in the past, but recently, the use of skip vias, which have a simple process and high accuracy, is increasing.

In addition, in order to implement these methods, the filling of via holes formed during the manufacturing process of the printed circuit board is required. A method of filling the via hole may comprise a filling method using insulating inks or electrically conductive paste, or a filling method using a plating method.

If the via hole is filled by the plating method, the occurrence of voids or dimples due to internal non-filling can be reduced, as compared to the case filled with insulating inks or electrically conductive paste, but there is a problem that the plating process takes a long time, and thus productivity is lowered. Here, in order to increase the productivity of the plating method, a method of reducing the time consumed in the plating process by applying a high current has been proposed, but as a high current is applied, excess hydrogen gas is generated during the plating process, the decomposition rate of the additive is accelerated and the concentration is non-uniform, and the plating is non-uniform, and thus there is a problem that the reliability and stability of the printed circuit board are deteriorated.

In particular, in the case of skip vias, narrower and deeper via holes are formed than conventional stacked vias, and thus such voids and dimples are likely to occur, and conventional levelers cannot be applied as they conventionally used levelers cannot be applied as they are. Therefore, it is required to develop a technology that can secure the reliability and stability of the printed circuit board while increasing the productivity of the plating method.

PRIOR ART DOCUMENT

Patent Document (Patent Document 1) (0001) Korean Laid-open Patent Publication No. 10-2019-0061627
(Patent Document 2) (0002) Korean Patent No. 10-0439534

DISCLOSURE

Technical Problem

In order to solve the above problems, the present invention is intended to provide a leveler capable of efficiently filling the inside of a via hole formed during the manufacturing process of a printed circuit board, and an electroplating composition containing the same.

Technical Solution

In order to solve the above problems, the present invention provides a leveler comprising a structural unit represented by Formula 1 or Formula 2 below.

[Formula 1]

[Formula 2]

(wherein,
$R_1$, $R_2$, $R_3$, and $R_4$ are each independently selected from the group consisting of hydrogen, a substituted or unsubstituted $C_1$ to $C_{10}$ alkyl group, a substituted or unsubstituted $C_1$ to $C_{10}$ heteroalkyl group, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ arylene group and a substituted or unsubstituted $C_6$ to $C_{20}$ heteroarylene group,
$A_1$ and $A_2$ are each independently selected from the group consisting of a substituted or unsubstituted $C_1$ to $C_{10}$ alkyl group, a substituted or unsubstituted $C_1$ to $C_{10}$ heteroalkyl group, a substituted or unsubstituted $C_1$ to $C_{10}$ alkene group, a substituted or unsubstituted $C_1$ to $C_{10}$ heteroalkene group, a substituted or unsubstituted $C_1$ to $C_{10}$ alkynyl group, a substituted or unsubstituted $C_1$ to $C_{10}$ heteroalkynyl group, a substituted or unsubstituted $C_6$ to $C_{20}$ arylene group, a substituted or unsubstituted $C_6$ to $C_{20}$ heteroarylene group, a substituted or unsubstituted $C_3$ to $C_{20}$ cycloalkyl group, a substituted or unsubstituted $C_1$ to $C_{20}$ heterocycloalkyl group and a substituted or unsubstituted imidazole group, and n is an integer from 1 to 10).

In one embodiment, $R_1$, $R_2$, $R_3$, and $R_4$ may be each independently selected from hydrogen, a $C_1$ to $C_{10}$ alkyl group, a $C_1$ to $C_{10}$ heteroalkyl group and a $C_6$ to $C_{20}$ arylene group.

In one embodiment, $A_1$ and $A_2$ may be each independently selected from the group consisting of a substituted or unsubstituted $C_1$ to $C_{10}$ heteroalkyl group, a substituted or unsubstituted $C_6$ to $C_{20}$ heteroarylene group, a substituted or unsubstituted $C_1$ to $C_{20}$ heterocycloalkyl group and a substituted or unsubstituted imidazole group.

The present invention also provides an electroplating composition comprising a metal ion source; the above-described leveler; an inhibitor; and a brightener.

In one embodiment, the inhibitor may be an alkoxylate alcohol-based polymer.

In one embodiment, the inhibitor may be a polymer formed by mixing propylene oxide and ethylene oxide at a weight ratio of 0.4:5 to 5:0.4.

In one embodiment, the brightener may have a disulfide bond and may include one or more mercapto functional groups.

In addition, the present invention provides a method of filling the via hole of the substrate comprising the steps of forming a via hole on the substrate; forming an electroless plating layer by performing electroless plating on the substrate on which the via hole is formed; and filling the via hole by performing electrolytic plating on the substrate on which the electroless plating layer is formed, wherein the electrolytic plating is performed by the electroplating composition.

In one embodiment, a current density of a pulse reverse current waveform may be applied in the electrolytic plating.

Advantageous Effects

If the filling of the via hole is carried out with the electroplating composition including the leveler according to the present invention, excessive generation of hydrogen gas and uneven plating can be solved even when a high current is applied, thereby improving the productivity, reliability, stability and the like of the printed circuit board.

In addition, the leveler according to the present invention can improve the fill-up effect in the via hole while maintaining a thin plating thickness, and thus can contribute to reducing production time and improving productivity compared to conventional filling methods.

BEST MODE

Hereinafter, preferred embodiments of the present invention will be described in detail. In describing the present invention, if it is determined that a detailed description of related known technologies may obscure the gist of the present invention, the detailed description thereof will be omitted. Throughout the specification, it is to be understood that the singular forms "a," "an," and "the" comprise plural referents unless the context clearly dictates otherwise, and it is to be understood that the terms such as "comprise" or "have" as used in the present specification, are intended to designate the presence of stated features, numbers, steps, operations, components, parts or combinations thereof, but not to preclude the possibility of the presence or addition of one or more other features, numbers, steps, operations, components, parts, or combinations thereof. In addition, in performing the method or preparation method, each process constituting the method may occur in a different order from the specified order unless a specific order is clearly described in context. That is, each process may occur in the same order as specified, may be performed substantially simultaneously, or may be performed in the reverse order.

The technology disclosed in this specification is not limited to the embodiments described herein and may be embodied in other forms. However, the embodiments introduced herein are provided so that the content disclosed herein may be thorough and complete, and the technical spirit of the present technology may be sufficiently understood by those skilled in the art. In the drawings, in order to clearly express the components of each device, the size of the components, such as width or thickness, is shown somewhat enlarged. Overall, when describing the drawings, it was described from the observer's point of view, and when one element is referred to as being located on another element, this comprises all meanings that one element may be located directly on another element or additional elements may be interposed between them. In addition, those skilled in the art will be able to implement the spirit of the present invention in various other forms within the scope that does not depart from the technical spirit of the present invention. In addition, the same reference numerals on a plurality of drawings refer to elements that are substantially the same as each other.

In this specification, the term 'and/or' comprises a combination of a plurality of recited items or any one of a plurality of recited items. In this specification, 'A or B' may comprise 'A', 'B', or 'both A and B'.

The present invention relates to a leveler comprising a structural unit represented by Formula 1 or Formula 2 below.

(wherein, $R_1$, $R_2$, $R_3$, and RA are each independently selected from the group consisting of hydrogen, a substituted or unsubstituted $C_1$ to $C_{10}$ alkyl group, a substituted or unsubstituted $C_1$ to $C_{10}$ heteroalkyl group, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ arylene group and a substituted or unsubstituted $C_6$ to $C_{20}$ heteroarylene group, $A_1$ and $A_2$ are each independently selected from the group consisting of a substituted or unsubstituted $C_1$ to $C_{10}$ alkyl group, a substituted or unsubstituted $C_1$ to $C_{10}$ heteroalkyl group, a substituted or unsubstituted $C_1$ to $C_{10}$ alkene group, a substituted or unsubstituted $C_1$ to $C_{10}$ heteroalkene group, a substituted or unsubstituted $C_1$ to $C_{10}$ alkynyl group, a substituted or unsubstituted $C_1$ to $C_{10}$ heteroalkynyl group, a substituted or unsubstituted $C_6$ to $C_{20}$ arylene group, a substituted or unsubstituted $C_6$ to $C_{20}$ heteroarylene group, a substituted or unsubstituted $C_3$ to $C_{20}$ cycloalkyl group, a substituted or unsubstituted $C_1$ to $C_{20}$ heterocycloalkyl group and a substituted or unsubstituted imidazole group, and n is an integer from 1 to 10).

As used herein, the term "alkyl" or "alkyl group", by itself or as part of another substituent, means a straight-chain or branched-chain, or cyclic hydrocarbon radical, or a combination thereof, unless otherwise specified, and it may be fully saturated, partially or fully unsaturated, and may contain divalent and polyvalent radicals having a specified number of carbon atoms (e.g., C1 to C10 means 1 to 10 carbons). Examples of saturated hydrocarbon radicals comprise, but are not limited to, groups such as methyl, ethyl, n-propyl, isopropyl, n-butyl, t-butyl, isobutyl, sec-butyl, cyclohexyl, (cyclohexyl)methyl, cyclopropylmethyl, for example, homologues and isomers of n-pentyl, n-hexyl, n-heptyl, n-octyl, and the like. The unsaturated alkyl group has one or more double bonds or triple bonds. Examples of the unsaturated alkyl group include, but are not limited to, vinyl, 2-propenyl, crotyl, 2-isopentenyl, 2-(butadienyl), 2,4-pentadienyl, 3-(1,4-pentadienyl), ethynyl, 1- and 3-propynyl, 3-butynyl, and higher homologs and isomers.

As used herein, the term "heteroalkyl" or "heteroalkyl group", by itself or in combination with another term, refers to a stable straight or branched chain, or cyclic hydrocarbon radical, or combinations thereof consisting of the stated number of carbon atoms and one or more heteroatoms selected from the group consisting of O, N, Si and S, unless otherwise stated, wherein the nitrogen and sulfur atoms may optionally be oxidized, and nitrogen heteroatoms may optionally be quaternized. The heteroatom(s), i.e., O, N and S and Si, can be placed at any internal position of the heteroalkyl group or at the position where the alkyl group is attached to the rest of the molecule. Examples thereof comprise, but are not limited to, —CH2-CH2-O—CH3, —CH2-CH2-NH—CH3, —CH2-CH2-N(CH3)-CH3, —CH2—S═CH2-CH3, —CH2-CH2-S(O)—CH3, —CH2-CH2-S(O)2-CH3, —CH═CH—O—CH3, —Si(CH3)3, —CH2-CH═N—OCH3, and —CH═CH—N(CH3)-CH3. For example, up to two heteroatoms may be consecutive, as in —CH2-NH—OCH3 and —CH2-OSi(CH3)3.

As used herein, the term "aryl" or "aryl group" refers to a polyunsaturated aromatic substituent which may be a single ring or multiple rings (preferably 1 to 3 rings) fused or covalently linked together, unless otherwise stated. In addition, the term "heteroaryl" refers to an aryl group (or ring) containing 1 to 4 heteroatoms selected from the group consisting of N, O, and S, wherein the nitrogen and sulfur atoms are optionally oxidized and the nitrogen atom(s) is optionally quaternized. The heteroaryl group can be attached to the rest of the molecule through a heteroatom. Non-limiting examples of the aryl and heteroaryl groups comprise, but are not limited to, phenyl, benzyl, 1-naphthyl, 2-naphthyl, 4-biphenyl, 1-pyrrolyl, 2-pyrrolyl, 3-pyrrolyl, 3-pyrazolyl, 2-imidazolyl, 4-imidazolyl, pyrazinyl, 2-oxazolyl, 4-oxazolyl, 2-phenyl-4-oxazolyl, 5-oxazolyl, 3-isoxazolyl, 4-isoxazolyl, 5-isoxazolyl, 2-thiazolyl, 4-thiazolyl, 5-thiazolyl, 2-furyl, 3-furyl, 2-thienyl, 3-thienyl, 2-pyridyl, 3-pyridyl, 4-pyridyl, 2-pyrimidyl, 4-pyrimidyl, 5-benzothiazolyl, purinyl, 2-benzimidazolyl, 5-indolyl, 1-isoquinolyl, 5-isoquinolyl, 2-quinoxalinyl, 5-quinoxalinyl, 3-quinolyl and 6-quinolyl. Substituents for each of the aforementioned aryl and heteroaryl ring systems are selected from the group of acceptable substituents described below.

As used herein, the term "arylene" refers to a polyunsaturated aromatic substituent which may be a single ring or multiple rings (preferably 1 to 3 rings) fused or covalently linked together. In the case of aryl, it is generally formed by removing one hydrogen atom from an aromatic hydrocarbon, the site of the removed hydrogen atom acts as a bonding site, but in the case of arylene, it means a compound in which two hydrogen atoms are removed and two bonding sites exist. Also, the term "heteroarylene" represents an arylene group (or ring) containing 1 to 4 heteroatoms selected from the group consisting of N, O, and S, wherein the nitrogen and sulfur atoms are optionally oxidized and the nitrogen atom(s) is optionally quaternized. The heteroarylene group can be attached to the rest of the molecule through a heteroatom.

As used herein, the term "alkene" or "alkene group" refers to an unsaturated alkyl group having a double bond, wherein one or more of the carbon-carbon bonds of the alkyl group have a double bond. Also, the term "heteroalkene" refers to an alkene group containing 1 to 4 heteroatoms selected from the group consisting of N, O, and S, wherein the nitrogen and sulfur atoms are optionally oxidized, and the nitrogen atom(s) is optionally quaternized.

As used herein, the term "alkynyl" or "alkynyl group" refers to an unsaturated alkyl group having a triple bond, wherein one or more of the carbon-carbon bonds of the alkyl group have a triple bond. Also, the term "heteroalkynyl" refers to an alkynyl group containing 1 to 4 heteroatoms selected from the group consisting of N, O, and S, wherein the nitrogen and sulfur atoms are optionally oxidized, and the nitrogen atom(s) is optionally quaternized.

As used herein, the term "cycloalkyl" or "cycloalkyl group" refers to a cyclic compound formed by three or more carbons, which does not have a benzene structure, unlike the aryl or arylene. Also, the term "heterocycloalkyl" refers to a cycloalkyl group (or ring) containing 1 to 4 heteroatoms selected from the group consisting of N, O, and S, wherein the nitrogen and sulfur atoms are optionally oxidized, and the nitrogen atom(s) is optionally quaternized. The heterocycloalkyl group can be attached to the rest of the molecule through a heteroatom.

As used herein, the term "imidazole" refers to a compound having a pentagonal ring structure composed of 3 carbon atoms and 2 nitrogen atoms, and may have the same structure as imidazole, which is generally manufactured and sold.

Specifically, when considering the interaction between the leveler and additives added to the electroplating composition (e.g., brightener, carrier, accelerator, etc.), $R_1$, $R_2$, $R_3$, and $R_4$ may be each independently selected from the group consisting of hydrogen, a $C_1$ to $C_{10}$ alkyl group, a $C_1$ to $C_{10}$ heteroalkyl group and a $C_6$ to $C_{20}$ arylene group.

In addition, $A_1$ and $A_2$ may be each independently selected from the group consisting of a substituted or unsubstituted $C_1$ to $C_{10}$ heteroalkyl group, a substituted or unsubstituted $C_6$ to $C_{20}$ heteroarylene group, a substituted or unsubstituted $C_1$ to $C_{20}$ heterocycloalkyl group and a substituted or unsubstituted imidazole group.

Here, the functional groups bonded to both ends of the compounds (monomers with n=1) represented by the structural units represented by Formula 1 and Formula 2 or the compounds (polymers with n=2 to 10) formed by combining a plurality of the structural units may be hydrogen (H) unless otherwise specified.

Specifically, when the leveler according to the present invention has the structure of Formula 1, it may be embodied as a compound containing a structural unit selected from the group consisting of structural units represented by Formulas 3 to 7 below (n=an integer of 1 to 10), but is not limited thereto.

[Formula 3]

[Formula 4]

[Formula 5]

[Formula 6]

[Formula 7]

In addition, when the leveler of the present invention has the structure of Formula 2, it may be embodied as a compound containing a structural unit selected from the group consisting of structural units represented by Formulas 8 to 12 below (n=an integer of 1 to 10), but is not limited thereto.

erazine, 4-chloro pyridine, 3-chloro pyridine, pyridazine, pyrimidine, 2-amino imidazole, 2,4'-bipyridyl, 2,4'-bipyridyl, 4,4'-bipyridyl and benzimidazole.

The temperature for dissolving the alkylation agent compound in the solvent is not particularly limited, but may be 50 to 180° C. In addition, the reaction ratio (a:b) of the

[Formula 8]

[Formula 9]

[Formula 10]

[Formula 11]

[Formula 12]

Meanwhile, the method for synthesizing the leveler according to the present invention is not particularly limited, but a method of reacting an alkylation agent compound with an amine-based compound in the presence of a solvent in order to increase synthesis efficiency may be applied. Specifically, the leveler according to the present invention can be synthesized by dissolving an alkylation agent compound in a solvent and then adding and reacting an amine-based compound. Here, the alkylation agent compound may be defined as a compound that imparts an alkyl group or an alkylene group in a molecule while performing a substitution reaction with the amine-based compound.

The alkylation agent compound is not particularly limited, but may be at least one selected from the group consisting of 1,4-dibromo benzene, 1-chloropropane, benzyl chloride, 1,6-dichlorohexane, 1,2-bis(2-chloroethoxy) ethane, dichloro-p-xylene and dichloro-m-xylene.

The amine-based compound is not particularly limited, but may be at least one selected from the group consisting of 1,2-bis(2-aminoethoxy) ethane, imidazole, pyrazine, pipalkylation agent compound (a) and the amine-based compound (b) is not particularly limited, but may be a weight ratio of 1:2 to 6:1. In addition, when two or more alkylation agents (a, a') are added, the reaction ratio (a:b) may be a weight ratio of 1:1 to 6:1, and the reaction ratio of a':b may be a weight ratio of 1:1 to 6:1.

The solvent used for dissolving the alkylation agent compound is not particularly limited as long as it is a commonly known solvent, but in consideration of solubility and synthesis efficiency, the solvent may be at least one selected from the group consisting of an aqueous solvent (water, purified water, deionized water, etc.), an alcohol-based solvent (ethanol, methanol, ethylene glycol, etc.) and an organic solvent (acetonitrile, dimethylformamide, dimethylacetamide, n-methyl-2-pyrrolidone, dimethyl sulfoxide, etc.).

The present invention provides an electroplating composition comprising the leveler. Specifically, the electroplating composition according to the present invention includes a metal ion source; the above-described leveler; an inhibitor; and a brightener.

The description of the leveler included in the electroplating composition according to the present invention is the same as described above, and thus will be omitted. The concentration (content) of this leveler is not particularly limited, but when considering the uniformity of the circuit pattern and plating efficiency, it may be 3 to 50 ppm, and specifically 7.5 to 20 ppm.

The metal ion source included in the electroplating composition according to the present invention supplies metal ions in the composition, and may be a commonly known material. Specifically, the metal ion source may be a copper ion source. The concentration (content) of the metal ion source is not particularly limited, but considering the uniformity and density of the circuit pattern, it may be 100 to 300 g/L, and specifically 100 to 250 g/L.

The brightener included in the electroplating composition according to the present invention is to promote plating by increasing the reduction rate of metal ions, and may be a commonly known material. Specifically, it is preferable that the brightener has a disulfide bond and contains one or more mercapto functional groups, and more specifically, it may be at least one selected from the group consisting of bis-(3-sulfopropyl) disulfide (sodium salt), 3-mercapto-1-propanesulfonic acid (sodium salt), 3-amino-1-propanesulfonic acid, O-ethyl-S-(3-sulphopropyl) dithiocarbonate (sodium salt), 3-(2-benzthiazoly-1-thio)-1-propanesulfonic acid (sodium salt) and N, N-dimethyldithiocarbamic acid-(3-sulfopropyl) ester (sodium salt). The concentration (content) of the brightener is not particularly limited, but considering the plating rate and the like, it may be 0.001 to 1 ml/L, and specifically may be 0.001 to 0.1 ml/L. If the brightener is less than the above range, it is difficult to expect the effect of the brightener. If the brightener exceeds the above range, plating growth is excessively promoted, and voids may occur inside the via hole.

The inhibitor comprised in the electroplating composition according to the present invention is to increase the surface flatness of the circuit pattern, and commonly known materials may be used. Specifically, an alkoxylate alcohol-based polymer may be used as this inhibitor, and a polymer in which propylene oxide and ethylene oxide are mixed in a weight ratio of 0.4:5 to 5:0.4 may be used. In addition, when using the polymer, the molecular weight of the polymer may be 3,000 to 10,000 g/mol, preferably 2000 to 5000 g/mol. Within the above molecular weight, normal plating and via hole filling performance may be exhibited, but if the molecular weight is out of the above range, the smoothness of the surface may be reduced, resulting in staining, which may deepen the depth of the dimple. The concentration (content) of the inhibitor is not particularly limited, but when considering the uniformity and plating efficiency of the circuit pattern, it may be 0.1 to 10 ml/L, and specifically 0.2 to 1.0 ml/L. If the inhibitor is included below the above range, it is difficult to expect the effect of the inhibitor. If the inhibitor is included in excess of the above range, staining may occur on the surface.

The present invention provides a method of filling via holes in a substrate with the electroplating composition. Specifically, the method of filling via holes in the substrate according to the present invention comprises the steps of forming a via hole in the substrate; forming an electroless plating layer by performing electroless plating on the substrate on which the via hole is formed; and filling the via hole by performing electrolytic plating on the substrate on which the electroless plating layer is formed, which will be described in detail with reference to FIG. 1 as follows.

First, a via hole H is formed in the substrate 201. The substrate 201 may be a substrate 201 made of a conventionally known insulating resin. The via hole H may be formed by laser processing or CNC processing. Here, the via hole H may be formed in the form of a groove that does not penetrate the substrate 201 or a hole that penetrates the substrate 201. In addition, in the case of the via hole, it may be manufactured in a form penetrating only one substrate, or each via hole may be vertically and continuously stacked (stacked via), and it may be manufactured in a form penetrating two or more substrate layers (skip via) (see FIGS. 1 and 2A-2C).

Figure 1:
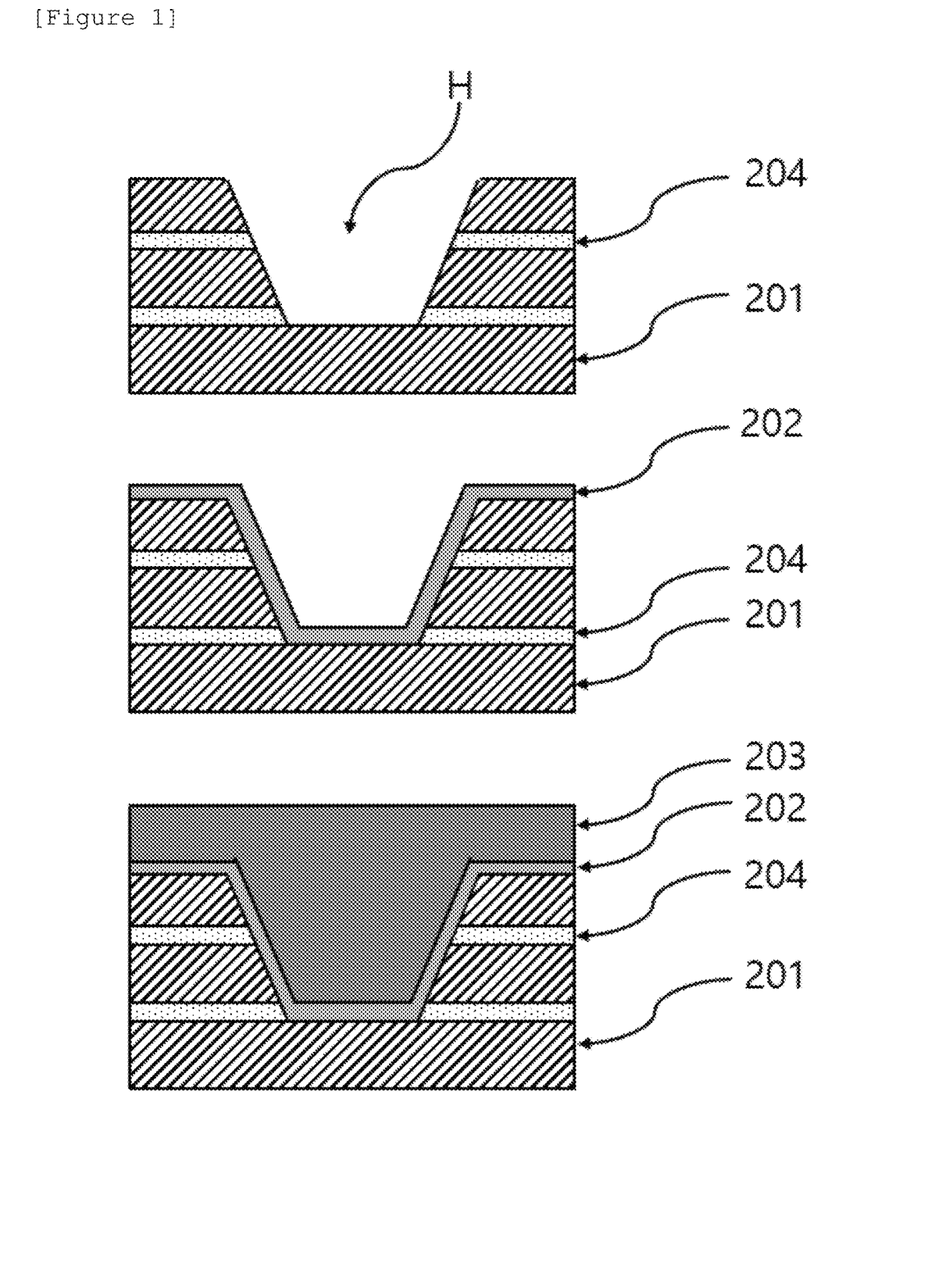
FIG. 1 briefly shows the filling process of via holes according to an embodiment of the present invention.

Next, the electroless plating is performed on the substrate 201, on which the via hole H is formed, to form an electroless plating layer 202 on the inside of the via hole H and the surface of the substrate 201. As a plating solution composition for performing the electroless plating, a commonly known composition may be used. As an example, a plating solution composition comprising copper ions, a copper ion complexing agent, a copper ion reducing agent, a pH adjusting agent and an additive may be used. In addition, the conditions of the electroless plating are not particularly limited, but may be made at a rate of 10 μm/hr in a temperature range of 20 to 60° C. and pH 11 to 14.

Then, electrolytic plating is performed on the substrate 201, on which the electroless plating layer 202 is formed, to fill the via hole H. That is, the electrolytic plating layer 203 is formed. As the plating solution composition for performing the electrolytic plating, the electroplating composition described above may be used.

Here, the current density applied during electrolytic plating with the electroplating composition may be applied as a specific waveform. That is, referring to FIG. 4, a current density of a step-wise pulse (+ current applied)-reverse (− current applied) waveform having a cycle of '$t_1+t_2+t_3+t_4+t_5+t_6$' may be applied. Specifically, a waveform maintaining the positive current $I_1$ for a time $t_1$, then the positive current $I_2$ for a time $t_2$, then the negative current $I_3$ for a time $t_3$, then the negative current $I_4$ for a time $t_4$, then the negative current $I_3$ for a time $t_5$, and then the positive current $I_2$ for a period for a time $t_6$ is periodically applied for a predetermined period of time to perform the electrolytic plating.

Figure 4:
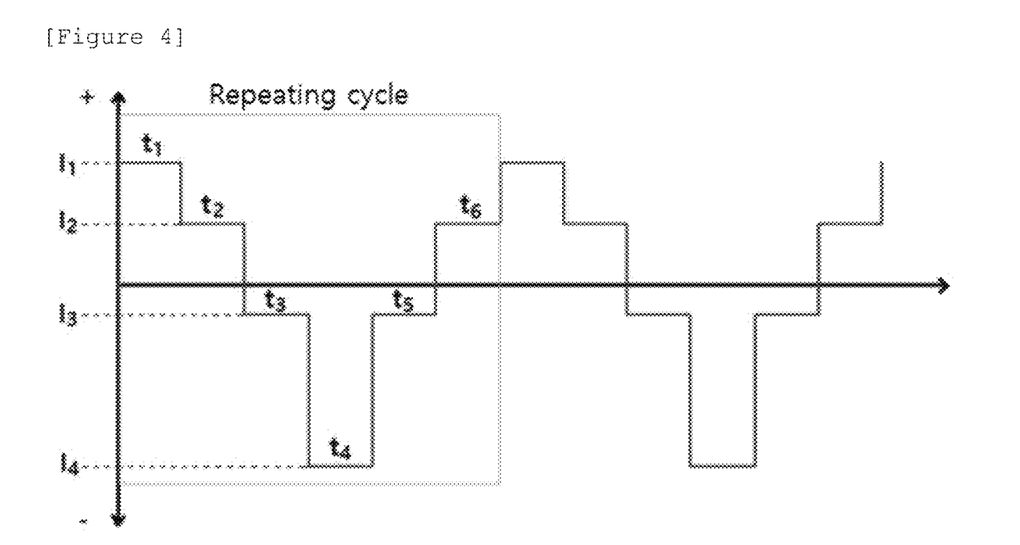
FIG. 4 is a graph showing the amount of current supplied in a pulse reverse current method according to an embodiment of the present invention.
Figure 5A:
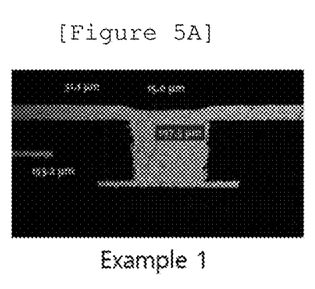
FIGS. 5A-5F show cross sections after filling of via holes according to an embodiment of the present invention.
Figure 5B:
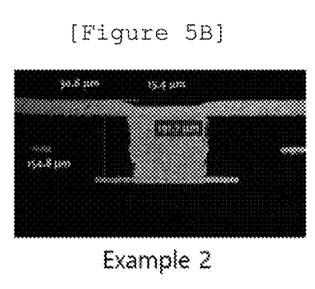
Figure 5C:
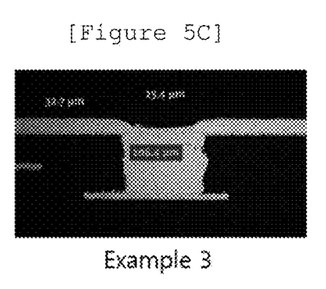
Figure 5D:
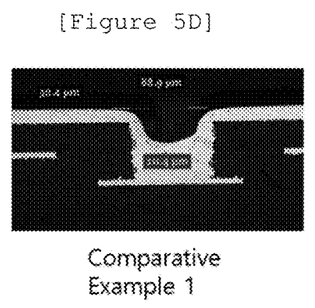
Figure 5E:
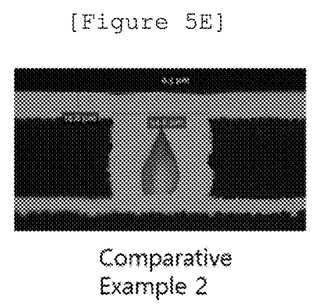
Figure 5F:
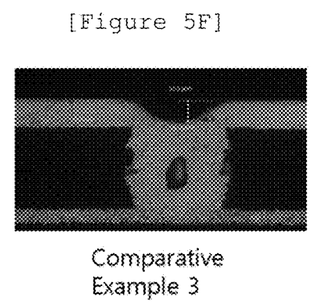
Figure 6A:
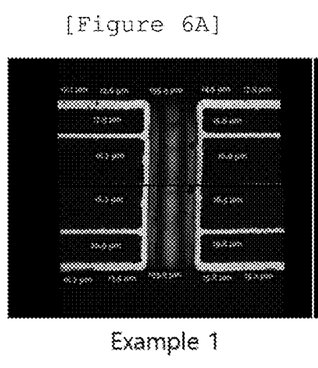
FIGS. 6A-6F show cross-sections after filling of through-holes according to an embodiment of the present invention.
Figure 6B:
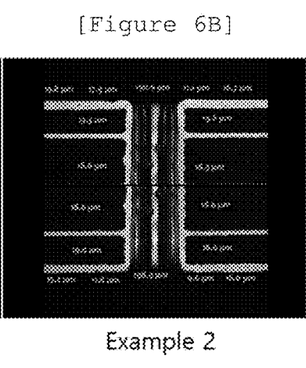
Figure 6C:
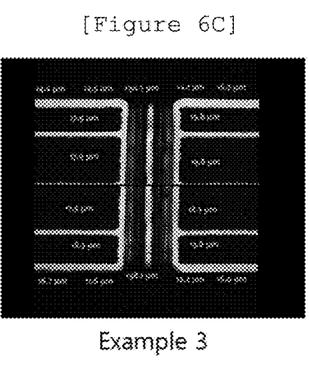
Figure 6D:
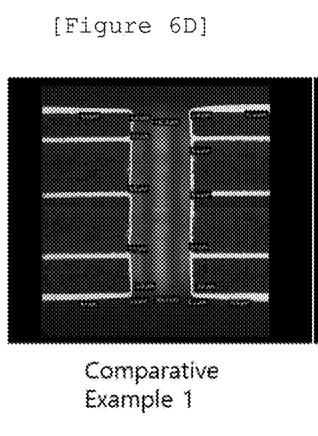
Figure 6E:
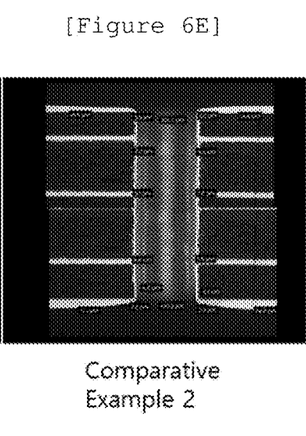
Figure 6F:
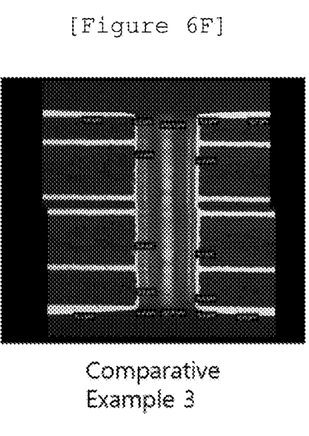

Here, in order to minimize the formation of dimples and voids during via hole H filling plating, $I_1$ may be 2 to 5 ASD, $I_2$ may be 1 to 2 ASD, $I_3$ may be −1 to −2 ASD, and $I_4$ may be −3 to −10 ASD. Also, $t_1$, $t_2$, and the may each be 10 to 80 ms (specifically, 30 to 50 ms), and $t_3$, $t_4$, and $t_5$ may each be 1 to 5 ms (specifically, 2 to 4 ms).

In this way, as the current density is applied as a step-by-step pulse-reverse waveform representing the cycle of '$t_1+t_2+t_3+t_4+t_5+t_6$' during the electrolytic plating, the electrolytic plating can be done in a relatively short time (specifically 20 to 40 minutes) while minimizing the formation of dimples and voids.

Hereinafter, preferred embodiments of the present invention will be described with reference to the accompanying drawings so that those skilled in the art can easily practice them. Also, in describing the present invention, if it is determined that a detailed description of related known function or known configuration may obscure the gist of the present invention, the detailed description thereof will be omitted. In addition, certain features presented in the drawings have been enlarged or reduced or simplified for ease of explanation, and the drawings and their components are not necessarily drawn to proper scale. However, those skilled in the art will readily understand these details.

Example 1

As a first amine (A1), 1,2-bis(2-aminoethoxy) ethane was mixed with water and then completely dissolved at a temperature of 80° C. After dissolution was completed, 1,3-dibromo benzene, which is a first alkylation agent (R1), was added and reacted for 8 hours. After the reaction was completed, 1-chloropropane, which is a second alkylation agent (R2), was added and reacted for 8 hours to synthesize a leveler compound (Formula 4). In this case, the weight ratio of A1 and R1 was set to 1:3, and the weight ratio of A1 and R2 was set to 1:3.

Example 2

As a first amine (A1), imidazole was mixed with ethanol and then completely dissolved at a temperature of 50° C. while refluxing. After dissolution was completed, 1,6-dichlorohexane, which is a first alkylation agent (R1), was added and reacted for 8 hours. After the reaction was completed, benzyl chloride, which is a second alkylation agent (R2), was added and reacted for 8 hours to synthesize a leveler compound (Formula 6). In this case, the weight ratio of A1 and R1 was set to 1:3, and the weight ratio of A1 and R2 was set to 1:3.

Example 3

Imidazole as a first amine (A1) and pyrimidine as a second amine (A2) were mixed with ethylene glycol and then completely dissolved at a temperature of 120° C. After dissolution was completed, 1,6-dichlorohexane, which is a first alkylation agent (R1), was added and reacted for 8 hours to synthesize a leveler compound (Formula 12). In this case, the weight ratio of A1 and A2 was set to 1:5, and the weight ratio of A1 and R1 was set to 1:3.

Comparative Example 1

1,2-bis(2-aminoethoxy) ethane as a primary amine (A1) was mixed with water and then completely dissolved at a temperature of 80° C. After dissolution was completed, 1,3-dibromo benzene, which is a first alkylation agent (R1), was added and reacted for 8 hours to synthesize a leveler compound. In this case, the weight ratio of A1 and R1 was set to 1:3.

Comparative Example 2

Pyrazine as a first amine (A1) and 2,4'-bipyridyl as a second amine (A2) were mixed with ethylene glycol and then completely dissolved at a temperature of 120° C. After dissolution was completed, 1,2-bis(2-chloroethoxy) ethane, which is a first alkylation agent (R1), was added and reacted for 8 hours to synthesize a leveler compound. In this case, the weight ratio of A1 and A2 was set to 1:5, and the weight ratio of A1 and R1 was set to 1:3.

Comparative Example 3

A known leveler (KBPA from Dicolloy company) was used.

Experimental Example 1

An electroplating composition containing 200 g/L of copper sulfate pentahydrate, 100 g/L of sulfuric acid, 50 mg/L of hydrochloric acid, 0.005 ml/L of bis-(sodium sulfopropyl)-disulfide, 0.5 ml/L of the inhibitor and 10 ml/L of the leveler of Example 1 was prepared.

Figure 3:
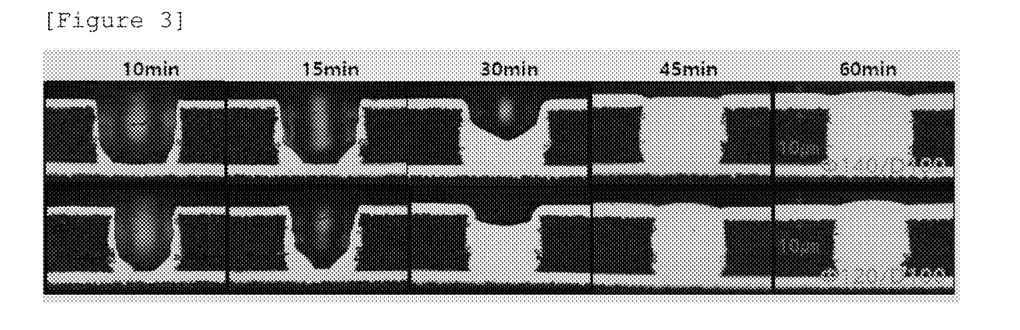
FIG. 3 is a photograph showing the filling process of via holes over time according to an embodiment of the present invention.

Via holes with a diameter of 120 and 140 μm and a depth of 100 μm were formed on an epoxy resin substrate having a thickness of 200 μm by laser processing. Next, an epoxy resin substrate having via holes was put into an electroless plating solution containing copper sulfate, EDTA, formalin, caustic soda, and an additive for surface stabilization, and electroless plating was performed at 65° C. to form a copper seed layer. Then, electrolytic plating was performed with the electroplating composition containing the leveler prepared in Example 1 to fill the via holes. When plating with the electroplating composition, the plating conditions were set as follows:

Electroplating composition temperature: 21 to 24° C.
Stirring: 0.5 to 1.5 LPM/con.
Electrode: Insoluble electrode
Current density: 3ASD In this case, in order to confirm the effect of filling with time, via holes were filled with different plating times, and each cross section is shown in FIG. 3. As shown in FIG. 3, it was confirmed that even when using a general current, it was possible to fill the via hole within 45 minutes without forming a void, and the occurrence of dimples was also minimized.

Experimental Example 2

An electroplating composition containing 200 g/L of copper sulfate pentahydrate, 100 g/L of sulfuric acid, 50 mg/L of hydrochloric acid, 0.005 ml/L of bis-(sodium sulfopropyl)-disulfide, 0.5 ml/L of the inhibitor and 10 ml/L of the leveler of Examples 1 to 3 and Comparative Example 1 to 3 was prepared.

A via hole having a diameter of 90 μm and a depth of 100 μm was formed by laser processing on a substrate of an epoxy resin having a thickness of 200 μm. Next, a substrate of an epoxy resin having via holes was put into the electroless plating solution containing copper sulfate, EDTA, formalin, caustic soda and an additive for surface stabilization, and electroless plating was performed at 65° C. to form a copper seed layer. Then, electrolytic plating was performed using the electroplating composition comprising the levelers prepared in Examples 1 to 3 and Comparative Examples 1 to 3, respectively, to fill the via hole. When plating with the electroplating composition, the plating conditions were set as follows:

Temperature of the electroplating composition: 21 to 24° C.
Stirring: 0.5 to 1.5 LPM/con.
Electrode: Insoluble electrode
Current density: applying the step-wise pulse-reverse waveform under the conditions of Table 1 below (see FIG. 4).

TABLE 1

| Current density | | Application time | | | Frequency (Hz) | Average current | | Duty cycle |
|---|---|---|---|---|---|---|---|---|
| $I_{for}$ (ASD) | $I_{rev}$ (ASD) | $T_{for}$ (sec) | $T_{rev}$ (sec) | $T_{off}$ (sec) | | $I_{for, AVG}$ (ASD) | $I_{rev, AVG}$ (ASD) | |
| 3.6 | 12 | 0.04 | 0.004 | 0.002 | 22 | 3.27 | 2.09 | 0.91 |

After completing the via hole filling plating, the cross-section of the substrate was confirmed with an optical microscope, and the result is shown in FIGS. 5A-5F.

As shown in FIGS. 5A-5F, in the case of Examples 1 to 3 of the present invention, it was possible to fill via holes without generating voids and dimples. However, in the case of Comparative Examples 1 to 3, the occurrence of dimples and voids was confirmed. That is, in the case of Examples of the present invention, high-speed plating was possible, when using the pulse reverse current waveform, but in the case of the Comparative Example, it was confirmed that occurrence of dimples and voids appears.

Experimental Example 3

When plating with the electroplating composition in Example 1, in order to confirm the conditions for applying the current density, via hole filling plating was performed while adjusting as shown in Table 2 below. After filling plating was completed, it was evaluated whether dimples and voids were formed on the cross section of the substrate, and the results are shown in Table 3 below. In this case, a direct current (DC) waveform, not a step-wise pulse-reverse waveform, was applied as a comparison condition.

TABLE 2

| Item | Current density | | Application time | | | Frequency (Hz) | Average current | | Duty cycle |
|---|---|---|---|---|---|---|---|---|---|
| | $I_{for}$ (ASD) | $I_{rev}$ (ASD) | $T_{for}$ (sec) | $T_{rev}$ (sec) | $T_{off}$ (sec) | | $I_{for, AVG}$ (ASD) | $I_{rev, AVG}$ (ASD) | |
| Condition 1 | 3.6 | 12 | 0.04 | 0.004 | 0.002 | 22 | 3.27 | 2.09 | 0.91 |
| Condition 2 | 3 | 6 | 0.04 | 0.002 | 0.002 | 23 | 2.86 | 2.45 | 0.95 |
| Condition 3 | 3.6 | 8 | 0.04 | 0.004 | 0.002 | 22 | 3.27 | 2.43 | 0.91 |
| Condition 4 | 3 | 5 | 0.04 | 0.002 | 0.002 | 23 | 2.86 | 2.50 | 0.95 |
| Comparison condition 1 | 1.2 | 0 | 0 | 0 | — | 1 | 1.20 | 0.00 | — |
| Comparison condition 2 | 2.4 | 0 | 0 | 0 | — | 1 | 2.40 | 0.00 | — |
| Comparison condition 3 | 3.6 | 0 | 0 | 0 | — | 1 | 3.60 | 0.00 | — |

TABLE 3

| Item | Via hole filling plating time (min) | Dimple (μm) | Void generation rate (%) |
|---|---|---|---|
| Condition 1 | 35 | 0 | 0 |
| Condition 2 | 29 | 5.3 | 1 |
| Condition 3 | 30 | 0 | 1 |
| Condition 4 | 29 | 7 | 0 |
| Comparison condition 1 | 60 | 0 | 3 |
| Comparison condition 2 | 30 | 34 | 0 |
| Comparison condition 3 | 20 | 99 | 0 |

Referring to Table 3 above, it can be confirmed that when filling via holes with the electroplating composition according to the present invention, as a step-wise pulse-reverse waveform is applied, plating is performed well even if the plating time for via hole filling is relatively short, thereby minimizing the occurrence of dimples and voids. Whereas, it can be confirmed that when applying a DC waveform, the plating time for 60 minutes or more is required to prevent dimples and voids from occurring, and when plating is performed within 30 minutes, dimples are severely generated.

Examples 4 to 11 and Comparative Examples 4 to 12

Experiments were conducted to confirm the occurrence of dimples and voids depending on the types of amine compounds (A1, A2) and alkylation agent compounds (R1, R2) used. Experiments were conducted using the combinations shown in Table 4 below, and levelers were synthesized using conditions similar to Examples 1 to 3 as each condition.

TABLE 4

| | A1 | A2 | R1 | R2 | Solvent | Mixing temperature |
|---|---|---|---|---|---|---|
| Example 4 | 1,2-Bis(2-aminoethoxy)ethane | | 1,3-Dibromobenzene | 1-Chloropropane | Water | 80 |
| Example 5 | Imidazole | | 1,6-Dichlorohexane | Benzylchloride | Ethanol | 50 |
| Example 6 | Pyrazine | | 1,6-Dichlorohexane | Benzylchloride | Ethanol | 50 |
| Example 7 | Piperazine | 3-Chloropyridine | 1,2-Bis(2-chloroethoxy)ethane | Dichloro-p-xylene | Ethanol | 50 |
| Example 8 | Imidazole | Pyrimidine | 1,6-Dichlorohexane | | Ethylene glycol | 120 |
| Example 9 | Imidazole | 2-Aminoimidazole | 1,2-Bis(2-chloroethoxy)ethane | | Ethylene glycol | 120 |
| Example 10 | Pyrazine | | 1,6-Dichlorohexane | Dichloro-p-xylene | Ethanol | 50 |
| Example 11 | Pyridazine | Pyrimidine | 1,2-Bis(2-chloroethoxy)ethane | Dichloro-m-xylene | Ethanol | 50 |
| Comparative Example 4 | 1,2-Bis(2-aminoethoxy)ethane | | 1,4-Dibromobenzene | | Water | 80 |
| Comparative Example 5 | Imidazole | 4-chloropyridine | 1,6-Dichlorohexane | | Ethanol | 50 |
| Comparative Example 6 | Pyrazine | 4-chloropyridine | 1,6-Dichlorohexane | | Ethanol | 50 |
| Comparative Example 7 | Pyrazine | 4-chloropyridine | 1,2-Bis(2-chloroethoxy)ethane | | Ethanol | 50 |
| Comparative Example 8 | Pyrazine | 2,4'-Bipyridyl | 1,2-Bis(2-chloroethoxy)ethane | | Ethanol | 50 |
| Comparative Example 9 | Pyrazine | 4,4'-Bipyridyl | Dichloro-p-xylene | | Ethanol | 50 |
| Comparative Example 10 | Piperazine | Benzimidazole | 1,6-Dichlorohexane | Dichloro-m-xylene | Ethylene glycol | 120 |
| Comparative Example 11 | Piperazine | 2,2'-Bipyridyl | 1,2-Bis(2-chloroethoxy)ethane | | Ethylene glycol | 120 |
| Comparative Example 12 | Piperazine | | Dichloro-p-xylene | | Ethylene glycol | 120 |

Experimental Example 4

Experiments were conducted in the same manner as Experimental Example 1 using Examples 4 to 11 and Comparative Examples 4 to 12, respectively. After completion of plating for filling, it was evaluated whether dimples and voids were formed on the cross-section of the substrate, and the results are shown in Table 5 below.

TABLE 5

| Item | Plating time for filling via hole (min) | Dimple (μm) | Void occurrence rate (%) |
|---|---|---|---|
| Example 4 | 35 | 0 | 0 |
| Example 5 | 29 | 0 | 0 |
| Example 6 | 34 | 1.1 | 0.3 |
| Example 7 | 30 | 0 | 0.1 |
| Example 8 | 28 | 0 | 0 |
| Example 9 | 29 | 2.3 | 0 |
| Example 10 | 31 | 0.8 | 0.1 |
| Example 11 | 33 | 0 | 0.2 |
| Comparative Example 4 | 44 | 1.4 | 5.9 |
| Comparative Example 5 | 42 | 5.7 | 6.4 |
| Comparative Example 6 | 46 | 5.9 | 3.8 |
| Comparative Example 7 | 38 | 7.4 | 3.8 |
| Comparative Example 8 | 64 | 5.8 | 3.5 |
| Comparative Example 9 | 48 | 11.8 | 2.9 |
| Comparative Example 10 | 50 | 6.7 | 4.8 |
| Comparative Example 11 | 34 | 5.4 | 5.4 |
| Comparative Example 12 | 32 | 1.1 | 6.8 |

As shown in Table 5, in the case of the combination of the Examples of the present invention, it was confirmed that the plating time of the via holes is reduced, and the height of the dimples is kept low. In addition, voids also rarely occur, indicating that it can be used for filling via holes. However, in the case of the combination of the Comparative Examples, it was found that as the plating time for filling was increased, the height of the dimples was increased, and the occurrence rate of voids was also increased.

Experimental Example 5

Experiments were conducted to confirm whether the leveler of the present invention was applied to the through-hole plating. Electroplating solutions (same as Experimental Example 2) containing the levelers of Examples 1 to 3 and Comparative Examples 1 to 3 were prepared, respectively, and then experiments were conducted to plate through-holes with a diameter of 200 μm and a depth of 400 μm. In this case, other conditions are the same as in Experimental Example 2 above.

TABLE 6

|  | Surface thickness (μm) | Inner wall thickness (μm) | Corner thickness (μm) |
|---|---|---|---|
| Example 1 | 16.6 | 17.2 | 14.1 |
| Example 2 | 16.9 | 18.6 | 12.6 |
| Example 3 | 16.0 | 18.7 | 13.1 |
| Comparative Example 1 | 12.1 | 7.7 | 6.9 |
| Comparative Example 2 | 16.5 | 8.3 | 6.0 |
| Comparative Example 3 | 13.9 | 9.2 | 6.0 |

As shown in Table 6 and FIGS. 6A-6F, in the case of Examples 1 to 3 of the present invention, it was possible to secure an appropriate plating thickness, but it was found that in the case of Comparative Examples, the thickness could not be secured under the same conditions. In particular, it was found that in the case of the Examples of the present invention, CPT (corner thickness/surface thickness) representing the effect of plating was able to secure 70% or more, but in the case of the Comparative Examples, it has less than 70%. In the case of TP (inner wall plating thickness/surface thickness), it was found that the Examples of the present invention showed more than 100%, whereas the Comparative Examples showed less than 100%, and thus the Examples of the present invention have better plating performance.

In the above, although specific parts of the content of the present invention have been described in detail, it will be clear to those skilled in the art that these specific descriptions are merely preferred embodiments, and the scope of the present invention is not limited thereby. Accordingly, the substantial scope of the present invention will be defined by the appended claims and their equivalents.

DESCRIPTION OF SYMBOL

201: Substrate
202: Electroless plating layer
203: Electrolytic plating layer
204: Middle plating layer

The invention claimed is:

1. A leveler represented by a compound, wherein the compound is Chemical Formula 8, wherein x is an integer, and y is an integer.

2. An electroplating composition comprising a metal ion source; the leveler according to claim 1; an inhibitor; and a brightener.

3. The electroplating composition according to claim 2, wherein the inhibitor is an alkoxylate alcohol-based polymer.

4. The electroplating composition according to claim 3, wherein the inhibitor is a polymer in which propylene oxide and ethylene oxide are mixed in a weight ratio of 0.4:5 to 5:0.4.

5. The electroplating composition according to claim 2, wherein the brightener is a compound having a disulfide bond and containing at least one mercapto functional group.

* * * * *